(12) United States Patent
Kim

(10) Patent No.: US 7,626,848 B2
(45) Date of Patent: Dec. 1, 2009

(54) DRAM INCLUDING A TUNABLE GAIN AMP AS A LOCAL SENSE AMP

(75) Inventor: Juhan Kim, San Jose, CA (US)

(73) Assignee: Fronteon Inc., San Jose, CA (US)

( * ) Notice: Subject to any disclaimer, the term of this patent is extended or adjusted under 35 U.S.C. 154(b) by 0 days.

(21) Appl. No.: 12/426,271

(22) Filed: Apr. 19, 2009

(65) Prior Publication Data

US 2009/0201718 A1    Aug. 13, 2009

Related U.S. Application Data

(63) Continuation of application No. 12/417,594, filed on Apr. 2, 2009, and a continuation of application No. 12/276,315, filed on Nov. 22, 2008, and a continuation of application No. 11/877,044, filed on Oct. 23, 2007, now Pat. No. 7,443,714.

(51) Int. Cl.
    G11C 11/24    (2006.01)

(52) U.S. Cl. ............ 365/149; 365/189.14; 365/194; 365/203; 365/229

(58) Field of Classification Search .......... 365/149, 365/189.14, 203, 229
    See application file for complete search history.

(56) References Cited

U.S. PATENT DOCUMENTS 5,715,189 A    2/1998    Asakura 6,426,905 B1    7/2002    Dennard et al.
6,456,521 B1    9/2002    Hsu et al.
2009/0190415 A1*    7/2009    Kim .................. 365/189.14

OTHER PUBLICATIONS

A hierarchical bit-line architecture with flexible redundancy and block compare test for 256 Mb DRAM in VLSI Circuits, Digest of Technical Papers, May 1993.
A 322 MHz Random-Cycle Embedded DRAM With High-Accuracy Sensing and Tuning, IEEE Journal of Solid-State Circuits, vol. 40, No. 11, Nov. 2005.
A 500MHz Random Cycle 1.5ns-Latency, SOI Embedded DRAM Macro Featuring a 3T Micro Sense Amplifier, IEEE International Solid-State Circuits Conference, pp. 486, 2007.

* cited by examiner

*Primary Examiner*—Hoai V Ho

(57) ABSTRACT

DRAM includes a tunable gain amp serving as a local sense amp, wherein the tunable gain amp is connected to a local bit line for reading a memory cell including a pass transistor and a capacitor, and gain of the tunable gain amp is adjusted by setting a local amp voltage for reading the memory cell more effectively with optimized gain. And a global sense amp is connected to the local sense amp for receiving a read output. When reading data, a voltage difference in the local bit line is converted to a time difference by the sense amps for differentiating high data and low data. For example, high data is quickly transferred to an output latch circuit through the sense amps with high gain, but low data is rejected by a locking signal based on high data as a reference signal. In addition, alternative circuits are described.

14 Claims, 7 Drawing Sheets

V1-V0 > VT

Reading data "1"

V0-V0 = 0 < VT

Reading data "0"

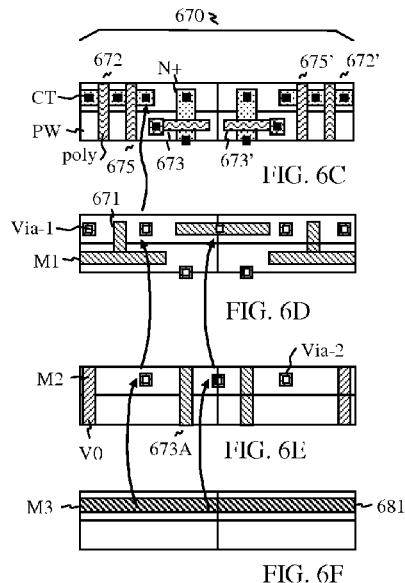
FIG. 6C
FIG. 6D
FIG. 6E
FIG. 6F
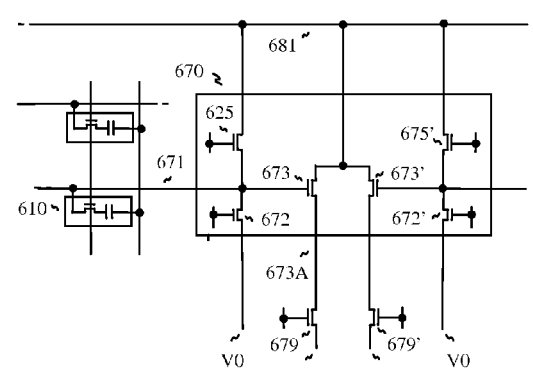
FIG. 6G
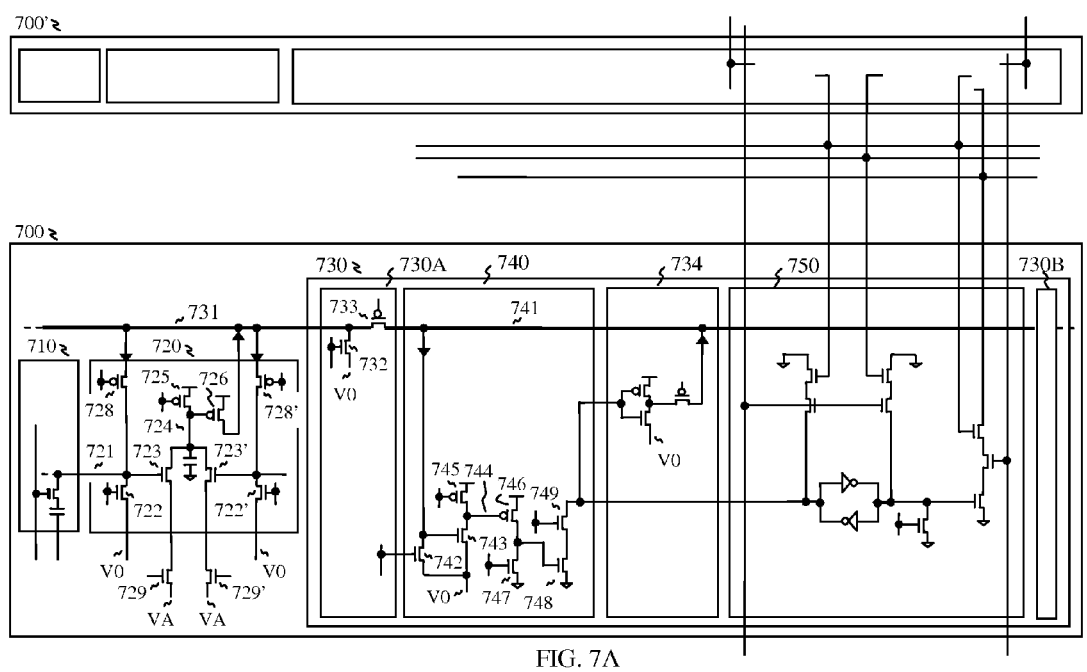
FIG. 7A

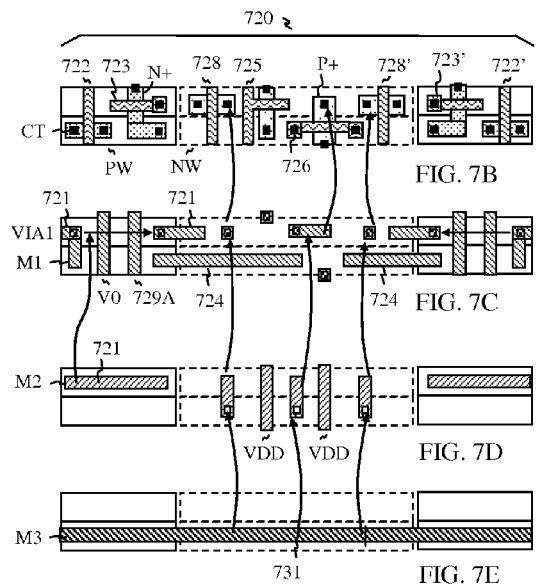
FIG. 7B
FIG. 7C
FIG. 7D
FIG. 7E
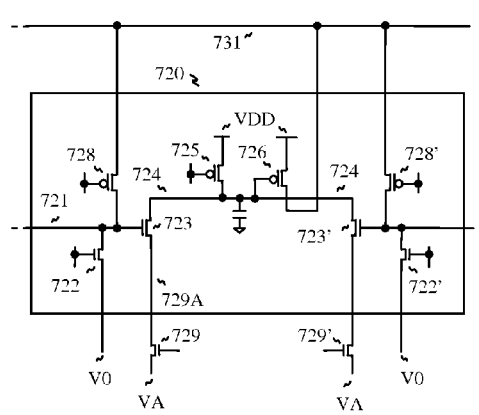
FIG. 7F
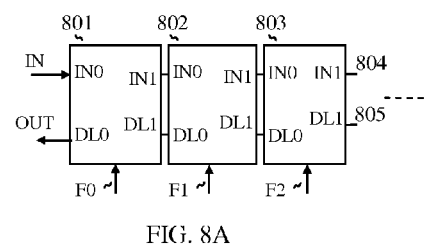
FIG. 8A
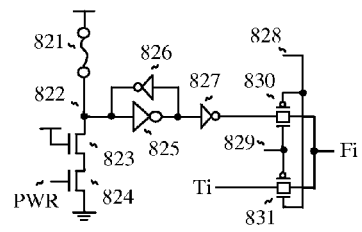
FIG. 8C
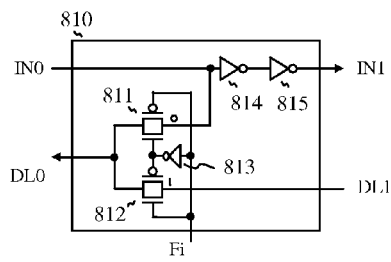
FIG. 8B
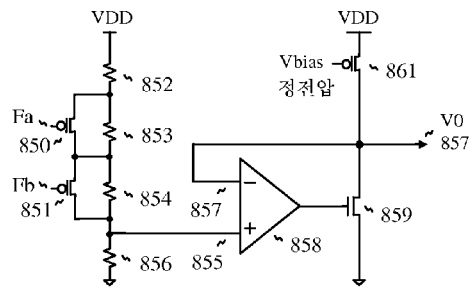
FIG. 8D

DRAM INCLUDING A TUNABLE GAIN AMP AS A LOCAL SENSE AMP

CROSS REFERENCE TO RELATED APPLICATION

The present invention is a continuation of application Ser. No. 11/877,044, filed on Oct. 23, 2007, now, U.S. Pat. No. 7,443,714, application Ser. No. 12/276,315, filed on Nov. 22, 2008, and application Ser. No. 12/417,594, filed on Apr. 2, 2009, which are herein incorporated by reference.

FIELD OF THE INVENTION

The present invention relates generally to integrated circuits, in particular to DRAM (Dynamic Random Access Memory).

BACKGROUND OF THE INVENTION

For its high-density, the DRAM (Dynamic Random Access Memory) is utilized extensively as a main memory in computer systems, even though it requires refresh cycle to sustain stored data within a predetermined refresh time. As such, the DRAM constitutes a key component that holds sway on the performance of the computer system. Efforts of research and development have been under way primarily to boost the density and also speed improvement.

In the conventional DRAM, hierarchical bit line architecture is applied to achieve high-speed operation, as published, "Hierarchical bitline DRAM architecture system" as U.S. Pat. No. 6,456,521, and "A hierarchical bit-line architecture with flexible redundancy and block compare test for 256 Mb DRAM" in VLSI Circuits, Digest of Technical Papers, May 1993. pp 93-94. More specifically, FIG. 1 illustrates a circuit diagram of the conventional DRAM. The memory cells 101 and 102 are connected to a local bit line 131, and the memory cells 103 and 104 are connected to another local bit line 133, where the plate of capacitor is connected to half VDD supply voltage typically. Local bit lines 131 and 133 are connected to a global bit line 111 and another global bit line 112 through transfer transistors 121 and 123, respectively. And more local bit lines 132 and 134 are connected to the global bit lines 111 and 112, respectively. When reading, one of memory cells is selected, and the selected cell charges or discharges the local bit line while the local bit lines and the global lines are released from pre-charge node 117, such that equalizer transistor 113, pre-charge transistors 114 and 115 are turned off by a control signal 116. Thus, one of global bit lines is also charged or discharged by the selected memory cell. After then sense amp 141 is activated to generate a read output 142. However, the selected global bit line is slowly changed because the selected memory cell should drive local bit line and global bit line through transfer transistor, where the global bit line increases total capacitance. Moreover, the storage capacitor in the memory cell should be relatively big in order to absorb the charges from the global bit line, which is one of major obstacles to reduce the DRAM cell. As a result, access time is also slow because of heavy global bit line, which increases propagation delay and sensing time for the sense amp.

And there is a prior art for improving DRAM with adding a local sense amp, as published, "High speed DRAM local bit line sense amplifier", U.S. Pat. No. 6,426,905, wherein the local sense amplifier detects a change of charge out of an input node, and comprises a first current source and a first field effect transistor. The current source is provided for removing charge from the input node. The field effect transistor includes (i) a source coupled to the input node, (ii) a gate electrode coupled to a first voltage, and (iii) a drain coupled to one side of a first capacitor, to an output node, and to a pre-charge circuit for setting the voltage of the output node to a second voltage, providing a voltage difference between the drain and source of said first transistor. The other side of the capacitor is coupled to ground. However, many transistors (total 11 transistors) for each local sense amplifier are required, such that chip area is sacrificed for the improvement.

And more prior arts are shown for dividing the bit line into short lines, "A 322 MHz Random-Cycle Embedded DRAM With High-Accuracy Sensing and Tuning", IEEE Journal of Solid-State Circuits, Vol. 40, No. 11, November, 2005, and "A 500 MHz Random Cycle 1.5 ns-Latency, SOI Embedded DRAM Macro Featuring a 3T Micro Sense Amplifier", IEEE International Solid-State Circuits Conference, pp. 486, 2007. However, those prior arts still use conventional differential sense amplifier for reading data from the memory cell. In consequence, the area of the chip is increased more, which is one of obstacles for realizing very high density and high speed memory.

Furthermore, memory cell structure of the conventional DRAM includes a cup-like capacitor as published U.S. Pat. No. 7,183,603 and a deep trench capacitor as published U.S. Pat. No. 6,608,341. Hence, scaling big storage capacitor is one of major obstacles, because total storage capacitance should be maintained around 20-30 fF for reading the memory cell through a heavy bit line and also retaining data within same or longer refresh time. In order to avoid forming the big storage capacitor, sensing scheme should be improved to read a reduced capacitor memory cell, which also should improve access time. And in order to retain data for long time even though the capacitor is reduced, leakage current of the memory cell should be reduced with sophisticated circuit techniques. For reading the reduced memory cell, more elaborated sense amp should be devised, such that gain of the sense amp should be adjusted for reading the memory cell more accurately. In this respect, there is still a need for improving the DRAM with new circuits. More detailed explanation will be described as below.

SUMMARY OF THE INVENTION

In the present invention, DRAM including a tunable gain amp as a local sense amp is realized, wherein the tunable gain amp is connected to a local bit line for reading a memory cell, and gain of the amp is tunable by setting a local amp voltage which is connected to a source of a local amplify transistor in the tunable gain amp. In doing so, the memory cell can be more effectively read with optimized gain. And a global sense amp is connected to the local sense amp for receiving a read output, wherein the global sense amp includes a read circuit, a latch circuit, a write circuit, and at least a select circuit, such that the read circuit reads the global bit line through the select circuit when reading, the latch circuit receives and stores an output from the read circuit or a pair of write data bus, the write circuit receives an output from the latch circuit and drives the global bit line through the select circuit when writing, and the global bit line is pre-set to a pre-set voltage by a global pre-set transistor of the select transistor when standby.

And the global sense amp includes a common line, such that the common line is used for connecting the read circuit, the latch circuit, the write circuit, the left select circuit and the right select circuit for transferring data to memory cells through multi-stage sense amps and reading a stored data from the memory cells through a select circuit. In doing so, the common line is useful for realizing a layout more effectively within a limited pitch, and also reducing area of the layout. And the global sense amp is efficiently connected to the local sense amp in the short bit line memory architecture for reading and writing data.

And with the short bit line memory architecture, there are many advantages. One of prime advantages is that a storage capacitor can be reduced. For example, 1 fF capacitor can be used for configuring the DRAM. For reading the 1 fF capacitor, bit line capacitance is proportionally reduced to around 1 fF by multi-dividing the bit line, which realizes fast read operation with multi-stage sense amps. When writing, the 1 fF capacitor is quickly charged by the write circuit of the global sense amp, so that write operation is improved. And write-back operation is executed by the write circuit with reduced voltage swing. With reduced swing voltage, pseudo negative word line scheme is realized for retaining the stored charges for long time. In doing so, high density DRAM can be fabricated with a large amount of logic circuits on a chip for configuring high performance system on chip, because 1 fF capacitor or below can be formed without complex capacitor forming process. On the contrary, the conventional DRAM uses a cup-like big capacitor, such as, 20~30 fF, as the storage capacitor. Hence, it is more difficult to fabricate the big capacitor on the wafer in the future, because feature size is approaching to almost scaling limit.

In order to realize the pseudo negative word line in the short bit line architecture, a pre-charge voltage V0 to a local bit line and a global bit line is generated by a variable voltage generator, so that the pre-charge voltage V0 is set around 0.4V for pre-charging the local bit line, for instance, while a supply voltage VDD for the pre-setting the local pre-set transistor 225 is set to 1.2V. Alternatively, the pre-charge voltage can be adjusted by setting fuse circuits, which enhances sensing margin or increasing retention time more flexibly.

For realizing high speed and low power DRAM with the small storage capacitor, bit line is multi-divided for reducing parasitic capacitance of the bit line, so that the lightly loaded bit line is quickly charged or discharge by the memory cell having the small capacitor when reading. And multi-stage sense amps are used, such that the memory cell is read by a first reduced swing amplifier serving as a local sense amp through the lightly loaded local bit line, and the local sense amp is read by a second reduced swing amplifier serving as a global sense amp through a global bit line. With multi-stage amps, fast read operation is realized. Furthermore, low power operation is realized with reduced swing amplifiers because voltage swing is reduced during operation. And also a write circuit is connected to the memory cell through the local bit line and the global bit line for limiting the voltage swing.

During read operation, a voltage difference in the local bit line is converted to a time difference for differentiating high data and low data. For example, high data is quickly transferred to an output latch circuit through the amplifiers with high gain, but low data is rejected by a locking signal based on high data as a reference signal. In this manner, time domain sensing scheme is realized to differentiate high (voltage) data and low (voltage) data. In detail, a reference signal is generated by one of fast changing data with high gain from reference cells, which signal serves as a reference signal to generate a locking signal in order to reject latching another data which is slowly changed with low gain, such that high voltage data is arrived first while low voltage data is arrived later, or low voltage data is arrived first while high voltage data is arrived later depending on configuration. The time domain sensing scheme effectively differentiates high voltage data and low voltage data with time delay control, while the conventional sensing scheme is current-domain or voltage-domain sensing scheme. In the convention memory, the selected memory cell charges or discharges the bit line, and the charged or discharged voltage of the bit line is compared by a comparator which determines an output at a time. With time domain sensing, there are many advantages to read the memory cell, so that the sensing time is easily controlled by a tunable delay circuit, which compensates cell-to-cell variation and wafer-to-wafer variation, thus there is a need for adding a delay time before locking the output latch circuit with a statistical data for all the memory cells, such as mean time between fast data and slow data. Thereby the tunable delay circuit generates a delay time for optimum range. And the read output from the memory cell is transferred to the output latch circuit through a returning read path, thus the access time is equal regardless of the location of the selected memory cell, which is advantageous to transfer the read output to the external pad at a time.

For storing the charges in the small storage capacitor within a predetermined retention time, pseudo negative word line scheme is devised, so that the word line of the memory cell is forced to ground voltage and the bit line is pre-charged to a limited voltage as a pre-charge voltage. Thus, negative word line is virtually forced for storing data "1" when a storage node voltage is charged near supply voltage because drain/source voltage to word line as a gate voltage is negative. This means that data "1" is stored under pseudo negative word line even though the word line is actually forced to ground voltage. However data "0" is rejected to be read by the locking signal in the time domain sensing scheme. In doing so, sub-threshold leakage current is significantly reduced in exponential subthreshold region of a MOS transistor while storing data "1". Furthermore, back bias voltage for a pass transistor of the memory cell is not required because back bias voltage is used for avoiding forward biasing from overshoot when storing data "0", while data "1" is reversed biased from the body. Without negative biasing to the body of the pass transistor, reverse leakage current is reduced with reduced potential difference between the storage node and the body while storing data "1" for long time. And, the time domain sensing scheme can effectively reject to be read data "0".

Configuring memory is more flexible, such that multiple memory macros can be configured with small segmented memory array and multi-stage sense amps, instead of big macro with the conventional sense amp which includes differential amps, write circuits and equalization circuits. And number of sense amps can be determined by the target speed. For example, high speed application needs more segmented array with more sense amps, while high density application needs more memory cells with reduced number of sense amps, thus cell efficiency is increased.

And, the local sense amp has high gain with wider channel MOS transistor than that of the memory cell. Hence, the stored data in the memory cell is quickly transferred to the latch in the global sense amp. After then, the data transfer circuit transfers a read output to data output node through buffers, which realizes fast read operation with no extra waiting time.

A buffered data path is connected to the global sense amp for writing and reading a data, wherein a write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIGS. 6C, 6D, 6E and 6F illustrate alternative layout for the local sense amp, and FIG. 6G illustrates the related local sense amp circuit for explaining the layout, according to the teachings of the present invention.

FIG. 7A illustrates an alternative local sense amp with PMOS main-amp transistor, and FIGS. 7B, 7C, 7D and 7E illustrate alternative layout for the local sense amp, and FIG. 7F illustrates the related local sense amp circuit for explaining the layout, according to the teachings of the present invention.

FIG. 8A illustrates a tunable delay circuit, FIG. 8B illustrates a delay unit of the tunable delay circuit, FIG. 8C illustrates a related fuse circuit for the tunable delay circuit, and FIG. 8D illustrates a variable voltage regulator for supplying variable voltage to the sense amps.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
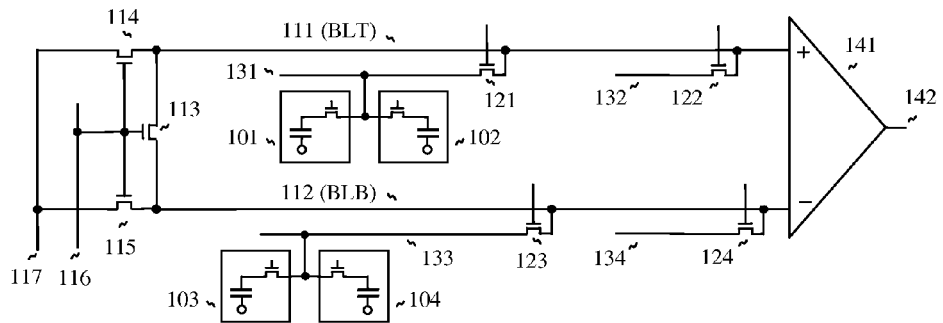
FIG. 1 illustrates a dynamic random access memory, as a prior art.
Figure 2A:
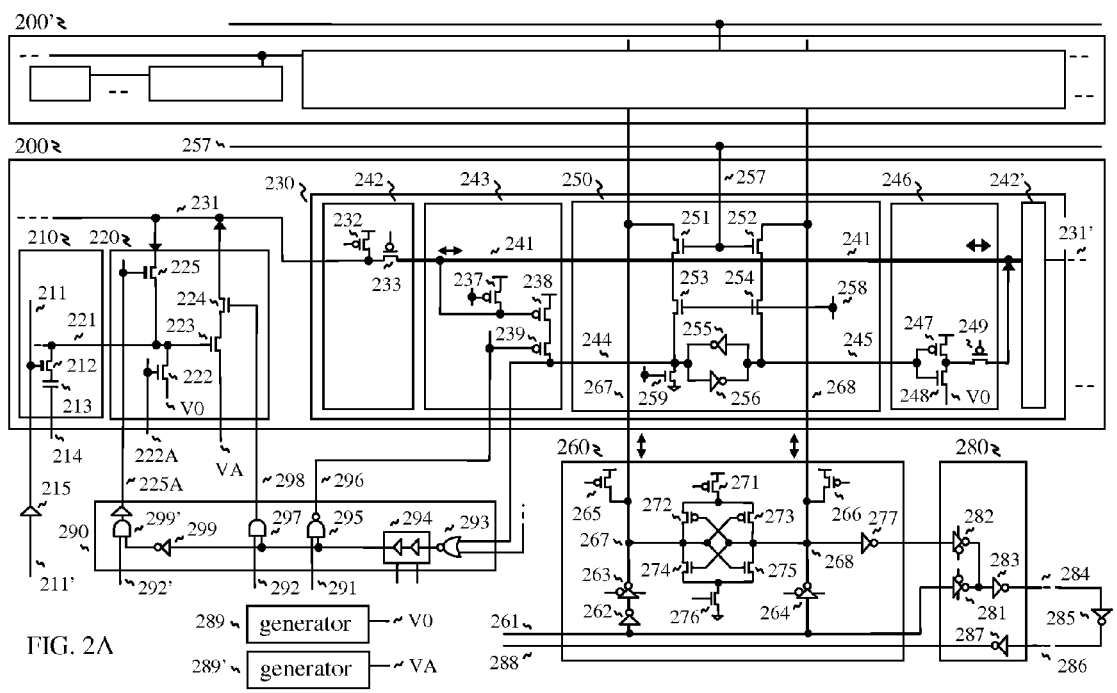
FIG. 2A illustrates DRAM including a tunable gain amp as a local sense amp as the present invention.

The present invention is directed to DRAM including a local sense amp as shown in FIG. 2A, wherein a memory block 200 comprises a memory cell 210, the local sense amp 220, and a global sense amp 230. The memory cell 210 is composed of a pass transistor 212 and a storage capacitor 213 which is connected to a plate line 214. And a word line 211 is connected to the pass transistor 212 for selecting the memory cell with pre-determined voltage VPP, where the word line 211 is generated by a level shifter 215 receiving row decoder output 211'. The local sense amp 220 is connected to the memory cell 210 through a local bit line 221. For reducing parasitic capacitance of the local bit line, reduced numbers of memory cells are connected to the local bit line, such as 16 cells, 24 cells, 32 cells, 48 cells, 74 cells and 128 cells, while 256 cells and 512 cells are connected to a bit line in the conventional DRAM. In doing so, the storage capacitor can be proportionally reduced for driving the short bit line. And the local sense amp is small for inserting repeatedly into the memory cell array while the conventional differential sense amp is too big to insert into the memory cell array.

The local sense amp 220 is connected to the local bit line 221, wherein the local sense amp 220 includes a local pre-charge transistor 222 for pre-charging the local bit line 221 to a pre-charge voltage V0, a local amplify transistor 223 for reading the memory cell 210 through the local bit line 221, such that the local amplify transistor 223 is serially connected to a local amp enable transistor 224 for enabling and a source of the local amplify transistor is forced to a local amp voltage VA for tuning gain. The tuning method will be explained as below in FIG. 2B. And a write transistor 225 is connected to the local bit line 221 for receiving a write data from a global bit line 231.

The local amplify transistor 223 serves as an inverting amplifier when reading. For example, the local amplify transistor 223 quickly discharges the global bit line 231 when the local bit line voltage is higher than threshold voltage of the local amplify transistor 223 whose source is forced to the local amp voltage VA, when the local amp enable transistor 224 is turned on. On the contrary, the local amplify transistor 223 discharges the global bit line 231 very slowly when the local bit line voltage is lower than threshold voltage of the local amplify transistor 223.

And the global sense amp 230 is connected to the local sense amp 220 through the global bit line 231, wherein the global sense amp 230 includes a common line 241 for connecting to its component circuits comprising a read circuit 243, a latch circuit 250, a write circuit 246, and at least a select circuit comprising a left select circuit 242 and/or a right select circuit 242', such that the read circuit 243 includes a common pre-set transistor 237 for pre-setting the common line 241 to a pre-set voltage such as a supply voltage and internal supply voltage, a global amplify transistor 238 for reading the common line 241, a global amp enable transistor 239 connecting to the global amplify transistor 238 serially.

And the latch circuit 250 includes a cross coupled inverter latch having inverters 255 and 256 for connecting a pair of latch nodes, a latch reset transistor 259 for resetting left latch node 244 which is connected to the global amp enable transistor 239 for receiving a read output from the read circuit 243, and a pair of series transistors having a row select transistor pair 253 and 254 for connecting to the pair of the latch nodes and a column select transistor pair 251 and 252 for connecting to a pair of data lines 267 and 268.

And the write circuit 246 includes an inverter receiving a voltage output of right latch node 245, and a write enable transistor 249 receiving an output of the inverter and driving the common line 241, where the inverter is composed of a pull-up transistor 247 and a pull-down transistor 248 which is supplied by the pre-charge voltage V0 from the pre-charge voltage generator 289. And the pre-charge voltage V0 is set by setting a fuse circuit (as shown in FIG. 7C) for adjusting voltage.

And the left select circuit 242 is composed of a global pre-set transistor 232 for pre-setting the global bit line 231 to the pre-charge voltage V0 and a global select transistor 233 for connecting the global bit line 231 to the common line 241 in the left hand side. And, the right select circuit 242' is composed of the same circuit as the left select circuit 242 for connecting a right global bit line 231' to the common line 241 in the right hand side.

And the global amp enable transistor 239 is controlled by a locking signal 296, such that the global amp enable transistor 239 is disabled after a read output from the memory cell is reached to the latch circuit 250. And the locking signal 296 is generated by a locking signal generator 290, wherein the locking signal generator 290 is composed of a NOR gate 293 for receiving an output from the latch circuit 250, a tunable delay circuit 294 (as shown in FIG. 8A) for delaying the read output of the latch circuit 250, and a NAND gate 295 for generating the locking signal 296, while a global read enable signal 291 is asserted to high. Another locking signal 298 is generated by an AND gate 297 receiving the delayed output, in order to disable the local amp enable transistor 224 while a local read enable signal 292 is asserted to high. And the locking signal 296 and 298 are generated as long as one of reference memory cells works correctly. And a local write enable signal 225A is generated by a level shifter through a NAND gate 299' and an inverter 299 after locking, when a write enable signal 292' is asserted to high during write-back operation or a write operation.

During read operation, a stored data in the memory cell 210 is transferred to the latch circuit 250 through the sense amps, for instance, high data is transferred to the latch circuit by the local sense amp 220 and the global sense amp 230 with high gain, but low data is not transferred with low gain because the global amp enable transistor 239 connecting to the latch circuit 250 is disabled by the locking signal 296 which is based on high data, before low data is arrived. Furthermore, the latch circuit is also used for write-back operation when the memory cell is accessed because the stored data in the memory cell 210 is destructed by the charges of the local bit line 221 when reading.

After the stored data is reached to the latch circuit 250, a row select signal 258 and a column select signal 257 are asserted to high, so that the read output is transferred to the data line sense amp 260 through the data line pair 267 and 268 while the latch reset transistor 259 is turned off. When reading data "1", a positive latch node 244 is raised to high from a reset state by the read circuit 243, which does not discharge the positive data line 267, but a negative data line 268 is discharged to VSS voltage because a negative latch node 245 is discharged when the read circuit 243 pulls up the positive latch node 244, while the data lines 267 and 268 are released from the pre-charge transistors 265 and 266. The row enable transistor pair 253 and 254 is disabled by the row select signal 258 for avoiding a conflict in unselected memory block (not shown), because the positive latch node 244 is reset to VSS voltage for unselected memory block, while the data line 267 is pre-charged to supply voltage VDD. Thereby, unnecessary current flow is avoided for the unselected memory block during operation.

After then, the data line sense amp 260 is activated by turning on a pull-up transistor 271 and a pull-down transistor 276, such that PMOS transistor 272 and NMOS transistor 275 are turned on, while PMOS transistor 273 and NMOS transistor 274 are turned off, when reading data "1". The data line sense amp 260 accelerates discharging the data line 268. By discharging the negative data line 268, output data 288 is changed to high through inverting buffers including 277, 282, 283, 285 and 287, because the data select circuit 280 selects a read tri-state inverter 282 for transferring the read output, while a bypass tri-state inverter 281 is turned off. And there are as many as memory blocks (not shown) in a chip, so that unselected memory blocks select the bypass tri-state inverter for transferring the read output to data output node. On the contrary, when reading data "0", the positive data line 267 is discharged but the negative data line 268 is not changed from the pre-charge state. Hence, the data out 288 keeps low.

And the read output is buffered by multiple inverting buffers 277, 282, 283, 285 and 287 including a forwarding read line 284 and a returning read line 286. With the returning read path, access time is almost same regardless of selected memory cell location, which realizes to latch the read output at a time with enough set-up and hold time even though a latch clock is fixed.

Figure 3A:
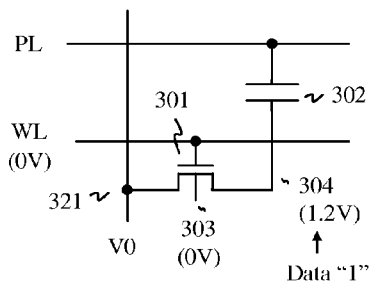
FIG. 3A illustrates a simplified schematic when storing data "1"
Figure 3B:
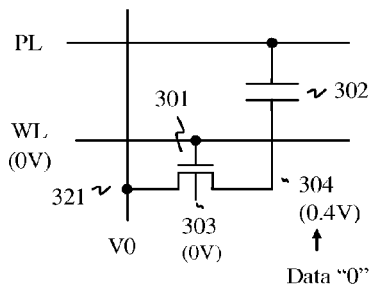
FIG. 3B illustrates a simplified schematic when storing data "0"
Figure 3C:
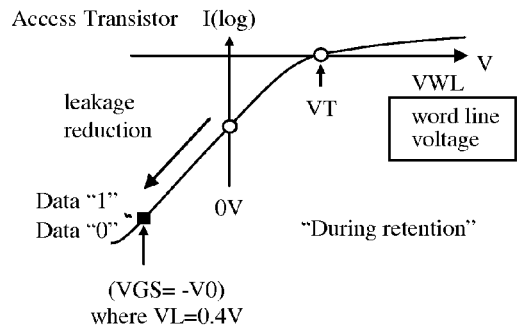
FIG. 3C illustrates subthreshold leakage current curve for the memory cell.
Figure 3D:
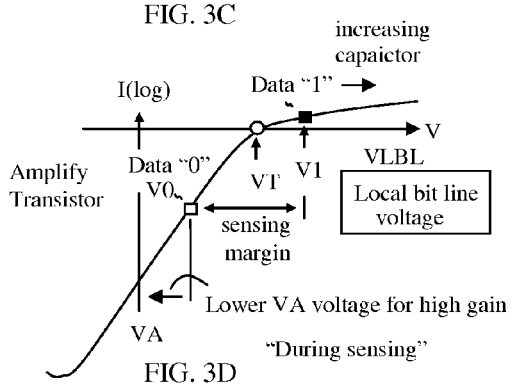
FIG. 3D illustrates I-V curve of the local amplify transistor.

In the present invention, the local sense amp need not reference bit line because the local sense amp does not compare voltage or current with reference bit line, but the local sense amp detects whether the local amplify transistor 223 is turned on or not by the selected memory cell through the local bit line 221 while the local amp voltage VA is used for tuning gain of the amplifier (as shown in FIG. 3D). Additionally, the local amplify transistor 223 can be composed of a low threshold MOS transistor as an alternative configuration for high speed application. Alternatively, the write transistor 225 can be composed of a low threshold MOS transistor as well for reducing threshold voltage drop.

For writing data, two write tri-state inverters 263 and 264 are turned on for driving the data line pair 267 and 268 respectively, while the data line sense amp 260 is de-activated by turning off pull-up transistor 271 and pull-down transistor 276, and the pre-charge transistors 265 and 266 are turned off as well. Thereby, write data is transferred to the latch circuit 250 through forwarding write line 261 and the two write tri-state inverters 263 and 264 with an inverter 262 for the positive data line 267. And then, the write data in the latch circuit is transferred to the memory cell through the write circuit 246, when the write enable transistor 249, the global select transistor 233 in the global sense amp 230 and the write transistor 225 in the local sense amp 220 are turned on. When writing data, the word line 211 is asserted to higher than VDD+VT voltage for avoiding NMOS threshold voltage drop where VDD is a supply voltage and VT is threshold voltage of the MOS transistor. During write operation, the local amp enable transistor 224 and the global amp enable transistor 239 are disabled for transferring the write data to the memory cell through the local bit line 221 and the global bit line 231. And swing voltage of the global bit line and the local bit line is limited by forcing a source of a pull-down transistor 248 of the write circuit 246 to the pre-charge voltage V0 when writing data "0" while a supply voltage VDD is forced to the pull-up transistor 247 when writing data "1".

Figure 2B:
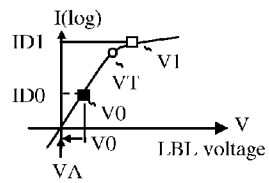
FIG. 2B illustrates an I-V curve of the local amplify transistor of the local sense amp when reading, FIG., 2C illustrates waveform of the local bit line when reading data "1"

Referring now to FIG. 2B in view of FIG. 2A, I-V curve of the local amplify transistor 223 is illustrated in logarithmic scale when reading. When the memory cell 210 stores data "1", the local bit line 221 is raised from V0 voltage to V1 voltage while the local pre-charge transistor 222 is turned off by de-asserting a pre-charge signal 222A to low, and the word line 211 is asserted to a predetermined voltage. For instance, the local bit line voltage is raised from the pre-charge voltage (at V0=0.4V) to 0.8V when the stored voltage in the memory cell is 1.2V, where local bit line capacitance (Cb) is 1 fF and the storage capacitance (Cs) is 1 fF. Thereby the local amplify transistor 223 is turned on, which flows ID1 current when the local amp voltage VA is applied to 0.4V. And, gain of the local sense amp can be adjustable when the local amp voltage VA can be lowered more because gate-to-source voltage of the local amplify transistor is increased. In doing so, the gain of the amplifier can be tunable by setting the local amp voltage VA which is generated by a local amp voltage generator 289'. And the local amp voltage generator 289' is set by a fuse circuit (as shown in FIG. 8C).

For sensing, the local amplify transistor 223 measures the voltage difference between the V0 voltage and the V1 voltage, where V0 is a local bit line voltage when reading data "0", and V1 is a local bit line voltage when reading data "1". When reading data "0", the local bit line voltage does not change from the pre-charged voltage V0 because the stored voltage of the memory cell is the same voltage of the local bit line. Thus, the V0 voltage is the same voltage of the data "0". And when reading data "1", the local bit line voltage is raised from the V0 voltage to V1 voltage. Hence V1 is defined as V1=V0+DV1, and DV1 is a raised voltage by the charges of the memory cell when storing data "1". In this manner, the V1 voltage is compared by the V0 voltage as a reference voltage.

For example, the V1 voltage is 0.4V higher than the V0 voltage, which is higher than threshold voltage of the local amplify transistor, so that the local amplify transistor 223 discharges the global bit line 231 while the global bit line 231 is released from the pre-set state. However, since the global bit line 231 is heavily loaded with long metal line, the discharge time of the global bit line 231 may be slow, which depends on a turn-on resistance of the local amplify transistor. In order to improve the discharge time when reading data "1", the local amp voltage VA can be lowered for increasing the gate-to-source voltage, which realizes the tunable local sense amp. As a result, the local amplify transistor 223 converts a voltage difference in the local bit line to a discharging time difference because the local amplify transistor 223 flows current ID1 as shown in FIG. 2B. Hence, the local sense amp can compare the data "1" and data "0" in logarithmic region, which is relative comparison. Alternatively, the local amplify transistor 223 can be composed of low threshold MOS transistor.

On the contrary, when the memory cell 210 stores data "0", the local bit line 221 keeps pre-charge voltage V0. Thereby gate-source voltage is 0V when the local amp voltage VA is set to the V0 voltage, which flows only leakage current ID0 through the local amplify transistor 223 and does not change the global bit line. Or the leakage current ID0 is slightly increased when the local amp voltage VA can be lowered to V0−0.1V, for instance.

Figure 2C:
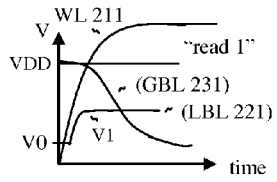
FIG. 2D illustrates waveform of the local bit line when reading data "0"
FIG. 2E illustrates timing diagram when reading data "1"
FIG. 2F illustrates timing diagram when reading data "0"
FIG. 2G illustrates simulated waveforms when reading data "1"
FIG. 2H illustrates simulated waveforms when reading data "0", according to the teachings of the present invention.

Referring now to FIG. 2C in view of FIG. 2A, waveform of the local bit line for reading data "1" is illustrated, wherein the local bit line (LBL) 221 is quickly charged to V1 voltage by raising the word line (WL) 211 to a predetermined voltage, only if the storage node of the selected memory cell stores high voltage data (data "1"). Thus the global bit line (GBL) 231 is quickly discharged by charging the local bit line.

Figure 2D:
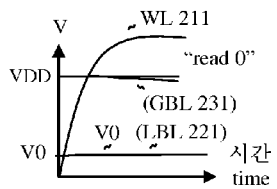

Referring now to FIG. 2D in view of FIG. 2A, waveform of the local bit line for reading data "0" is illustrated, wherein the local bit line (LBL) 221 is not changed from the V0 voltage by raising the word line (WL) 211, only if the storage node of the selected memory cell stores low voltage data (data "0"). Hence the global bit line (GBL) 231 is very slowly discharged by leakage current.

Figure 2E:
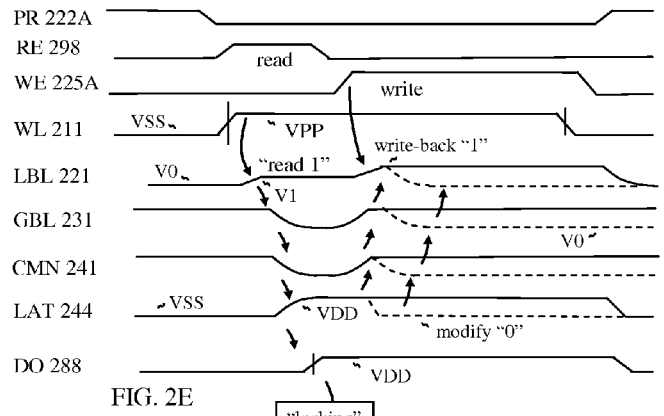

Referring now to FIG. 2E in view of FIG. 2A, detailed timing for reading data "1" is illustrated. To read data, the pre-charge (PR) signal 222A is de-asserted to low for releasing the local bit line 221, and then the word line 211 is raised to a predetermined voltage. By raising the word line, the local bit line (LBL) 221 is charged to V1 voltage from the pre-charge voltage V0, because the memory cell 210 stores high data, while the local amp enable transistor 224 is turned on by asserting read enable signal (RE) 298, but the write transistor 225 is turned off. Thus the local amplify transistor 223 is turned on, which discharges the local global bit line (GBL) 231 to VA voltage from a pre-set voltage VDD.

When the global bit line 231 is discharged, the read circuit 243 detects the discharge through the common line (CMN) 241, which changes the (positive) latch node (LAT) 244 of the latch circuit 250 while the latch reset transistor 259 is turned off. And then, the read output in the latch circuit is transferred to the data lines 267 and 268, respectively, while the pre-set transistors 265 and 266 are turned off. And the data line sense amp 260 is activated to amplify the data line voltage, such that the negative data line 268 is quickly discharged while the positive data line 267 keeps high. By discharging the negative data line 268, the data output (DO) 288 is changed to high through the inverting buffers including 282, 283, 285 and 287, while the read tri-state inverter 282 is turned on but the bypass tri-state inverter 281 is turn-off state.

After reading, write-back operation is executed, such that the read data in the negative latch node 245 is written back to the memory cell through the write transistor 225, when a write enable signal (WE) 225A is asserted. Or read-modify-write operation can be executed, where broken lines in the local bit line (LBL) 221 and the global bit line (GBL) 231 illustrate to modify from data "1" to data "0", so that the local bit line 221 and the storage node (not shown) are inverted by the modified data. After write-back operation, all the control signals including the pre-charge signal (PR) 222A, the word line, and other control signals, are returned to the pre-charge state or standby mode. And, during standby, the write line 261 keeps low for pre-setting an output node of the bypass tri-state inverter 281 to high, because the bypass tri-state inverter 281 is turned on, which prevents a conflict with high data from the read tri-state inverter 282 when the memory block is activated.

Figure 2F:
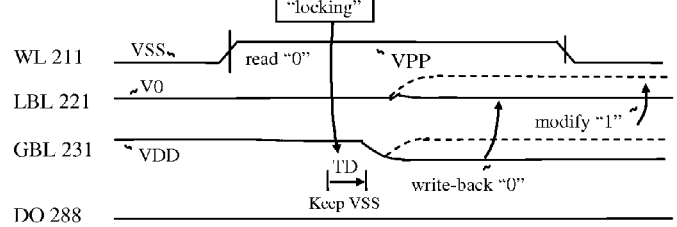

Referring now to FIG. 2F in view of FIG. 2A, detailed timing for reading data "0" is illustrated, wherein the local bit line (LBL) 221 keeps V0 voltage when the stored voltage in the memory cell is near V0 voltage, which keeps the local amplify transistor 223 on turn-off state. Thereby, the global bit line 231 keeps the pre-set state at VDD voltage, which does not change the latch circuit 250. And other read path keeps the reset and the pre-charge state. Hence the data output (DO) 288 keeps the VSS voltage. However, the global bit line 231 and the common line 241 can be very slowly discharged by turn-off current through the local amplify transistor 223. The turn-off leakage current depends on transistor parameters, temperature and substrate voltage for the transistor. Hence, the global bit line 231 may be gradually pulled down, which may change the latch circuit 250 while the global amp enable transistor 239 is enabled. For reducing turn-off current, long channel transistors can be used for the local amplify transistor 223 and the global main-amp transistor 238, while the global pre-set transistor 232 and the common pre-set transistor 237 can be composed of relatively short channel transistor, which helps to keep the pre-set state when reading data "0", alternatively. In order to avoid the false flip with the leakage current when reading data "0", the global amp enable transistor 239 is turned off by the locking signal 296 which is generated by a delay circuit 290 as a locking signal generator receiving fast data (data "1") with delay time as shown TD, so that data "0" is rejected to be latched to the latch circuit because data "0" is arrived later. This means that the latch circuit 250 keeps the reset state when reading data "0", such that this operation is called locking with the locking signal. After reading data "0", the write-back operation is executed by asserting the write enable signal 225A. And then, all the control signals including the word line, the write enable signal and others are returned to the pre-charge state or standby mode.

In this manner, the locking signal 296 effectively differentiates high data and low data where the memory block 200 serves as a reference memory block storing data "1" while a main memory block 200' stores main data, so that this sensing scheme is called "time domain sensing scheme", which can differentiate high data and low data within a predetermined time domain even though the leakage current is relatively high. Thereby, data "1" in the memory cell 210 is quickly transferred to the latch circuit through the local sense amp with high gain, which generates the locking signal, but data "0" is not transferred with low gain, thus the locking signal effectively rejects data "0" not to be latched. In other words, fast cycle memory (with no page mode) does not require the locking signal which is generated by the reference signal based on reference cells storing data "1", because data "0" is not reached to the latch within a short cycle. Thus, an enable signal from a control circuit is used to control the global amp enable transistor for fast cycle operation, which does not require reference cells and related circuits. And by applying multi-divided bit line architecture, fast read operation and write operation are realized. And also the memory cell can be reduced, because the memory cell drives only lightly loaded bit line, which means that the capacitor can be reduced for realizing very high density memory.

Figure 2G:
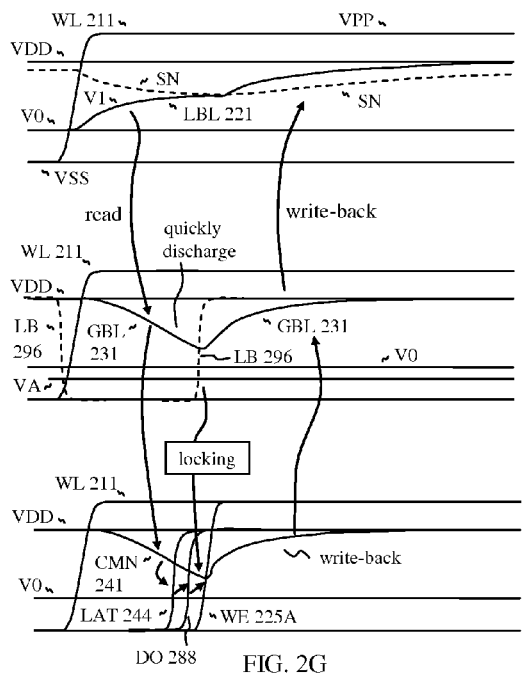

In FIG. 2G, simulated waveforms (which are duplicated from the SPICE simulator output with painstaking) are illustrated when reading data "1", wherein stored charges in the storage node (SN) is re-distributed with charges in the local bit line (LBL) 221 after the word line (WL) 211 is asserted to a pre-determined voltage. The local bit line (LBL) 221 is raised to V1 voltage from V0 voltage, by positive charges in the storage node (SN) for data "1" (D1). For enabling the sense amps, a (negative) locking signal (LB) 296 is lowered and then raised to VDD voltage after reading. Hence, the global bit line (GBL) 231 is discharged by the local sense amp. By discharging the global bit line (GBL) 231, the latch node (LAT) 244 of the latch circuit 250 is changed. And the changed data is transferred to data output (DO) 288. After changing the latch node, the locking signal (LB) 296 is generated. And the locking signal (LB) 296 locks the global sense amp. And then, the write enable (WE) signal 225A is asserted for the write-back operation, which restores the read data or modifies an inverted data to the storage node (SN) of the memory cell.

Figure 2H:
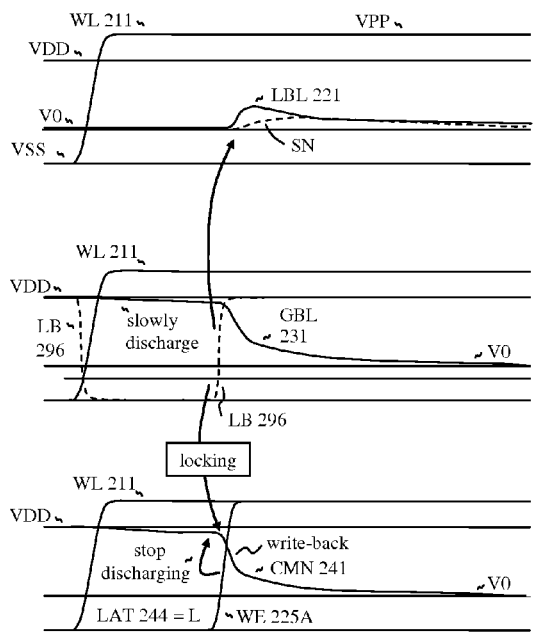

In FIG. 2H, simulated waveforms are illustrated when reading data "0", wherein the local bit line (LBL) 221 is not changed from V0 voltage or very slightly changed. Thus, the global bit line (GBL) 231 is not changed. And the latch node (LAT) 244 of the latch circuit is not changed either. After then, locking operation and write-back operation are executed as reading data "1" similarly.

In FIG. 3A, a simplified schematic when storing data "1" is illustrated for explaining the pseudo negative word line scheme, wherein the word line (WL) of the memory cell is asserted to VSS voltage, the local bit line 321 is pre-charged to V0 voltage, for example, 0.4V, and the storage node 304 is charged to VDD voltage (1.2V), when storing data "1". Thus, gate-to-source voltage of the pass transistor 301 is negative 0.4V, even though the word line is forced to ground voltage.

As shown in FIG. 3B, when storing data "0", gate-to-source voltage of the pass transistor 301 is negative 0.4V as well, while the storage node 304 is charged to V0 voltage, 0.4V, and the local bit line is also charged to V0 voltage.

In FIG. 3C, subthreshold leakage current curve of the pass transistor 301 is illustrated, wherein the word line voltage (WL) is negative V0 voltage when storing data. As a result, subthreshold leakage current through the pass transistor is exponentially reduced in exponential subthreshold region. Hence, retention time of the present invention is drastically longer than that of the conventional DRAM including 30 fF big capacitor, even though the storage capacitor is reduced to 1 fF from 30 fF. Furthermore, the body 303 of the pass transistor is forced to ground voltage. On the contrary, the body is forced to negative voltage in the conventional DRAM. With ground body potential, reverse bias leakage current is significantly reduced in exponential reverse bias region as well. Alternatively, the voltage V0 can be adjusted by the pre-charge voltage generator with a fuse circuit, which is more flexible for improving retention and sensing operation, such that retention time is increased by raising the V0 voltage but sensing margin is reduced as long as a supply voltage VDD is constant. Inversely, sensing margin is increased while retention time is decreased by lowering the V0 voltage.

In FIG. 3D, I-V curve of the local amplify transistor (shown in FIG. 2B) is illustrated again for explaining increase sensing margin. When reading data "1", local bit line voltage is raised over the threshold voltage of the local amplify transistor. For instance, strong memory cell exhibits higher voltage than threshold voltage (VT) but weak memory cell exhibits near threshold voltage (VT). In either way, data "1" is quickly transferred to the global sense amp with high gain, but data "0" is not reached without any gain, because gate-to-source voltage of the local amplify transistor is distributed around 0V. In order to increase sensing margin for reading data "1", the storage capacitor is increased, so that the local bit line voltage is raised higher by the stored charges of the capacitor. When the local bit line raised higher, the global bit line is discharged quickly, For enhancing the discharging time, the source voltage VA of the local amplify transistor is slightly lowered, which increases gain of the local amplify transistor. In doing so, sensitivity is increased for differentiating data "1" and data "0".

Figure 3E:
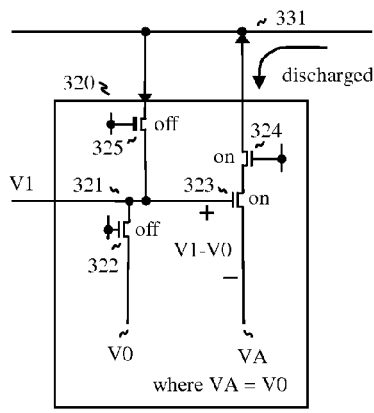
FIG. 3E illustrates reading data "1"

In FIG. 3E, reading data "1" is illustrated for ease of understanding. When reading data "1", the local bit line 321 is raised to the V1 voltage as explained above, so that the local amplify transistor 323 is turned on and discharges the global bit line 331 quickly, while the local amp enable transistor 324 is turned on but the local pre-charge transistor 322 and the local write transistor 325 are turned off.

Figure 3F:
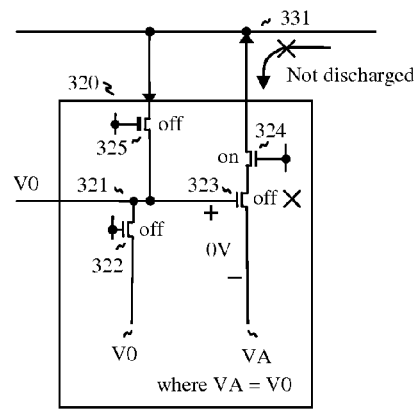
FIG. 3F illustrates reading data "0", according to the teachings of the present invention.

And in FIG. 3F, reading data "0" is illustrated. When reading data "0", the local bit line 321 keeps the V0 voltage, so that the local amplify transistor 323 keeps turn-off state because gate-to-source voltage of the local amplify transistor is 0V (V0−V0=0V), which does not discharge the global bit line 331, while the local amp enable transistor 324 is turned on but the local pre-charge transistor 322 and the local write transistor 325 are turned off. In doing so, the read operation is to compare the V1 voltage and the V0 voltage, where the V1 voltage is exhibited by the data "1", and the V0 voltage is exhibited by the data "0". This means that the local sense amp 320 compares the data "1" and the data "0" consequently, where the local amp voltage VA is same as the V0 voltage. In order to increase sensing margin and discharge the global bit line quickly when reading data "1", the V1 voltage should be higher than threshold voltage of the local amplify transistor 323 with increasing the storage capacitor. Or the local amp voltage VA can be slightly lowered for increasing sensitivity of the local amplify transistor alternatively.

Figure 4:
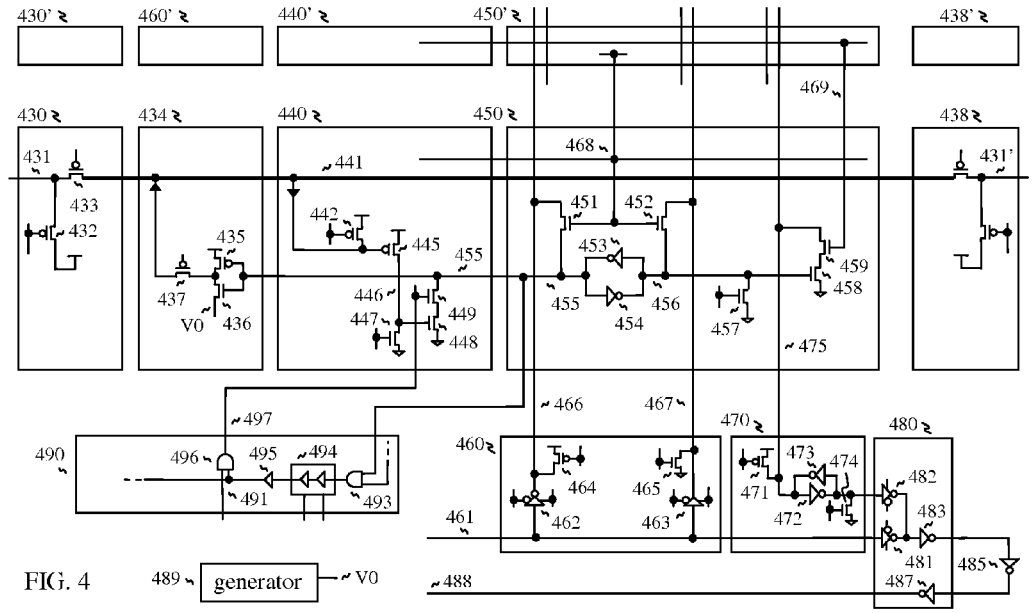
FIG. 4 illustrates an alternative global sense amp with NMOS read circuit, according to the teachings of the present invention.

And there are various alternatives for improving the circuits. For example, PMOS pull-up transistors in the latch circuit can be replaced with NMOS pull-down transistors for improving read operation. In FIG. 4, an alternative global sense amp with NMOS read circuit is illustrated, wherein the NMOS pull-down transistors can strongly pull down a latch node of the latch circuit, when reading data "1".

More specifically, the global sense amp includes a read circuit 440, a latch circuit 450, a write circuit 434, a left select circuit 430 and a right select circuit 438, and those circuits are connected to a common line 441, where the left select circuit 430 and the right select circuit 438 are connected to a left global bit line 431 and a right global bit line 431' respectively, for connecting to multiple local sense amps (not shown). In the configuration, the left select circuit 430 is composed of a global pre-set transistor 432 for pre-setting the left global bit line 431 and a global select transistor 433 for selecting the left global bit line 431, and the right select circuit 438 is composed of the same circuit as the left select circuit.

And the read circuit 440 with NMOS pull-down transistors 448 and 449 is composed of a common pre-set transistor 442 for pre-setting the common line 441, a global pre-amp transistor 445 for reading the common line 441, a global (amp) reset transistor 447 for resetting a global pre-amp node 446 connecting to the global pre-amp transistor 445, and the global main-amp transistor 448 for reading the global pre-amp node 446 when the global amp enable transistor 449 is enabled. And the global amp enable transistor 449 is connected to the left latch node 455 as a negative latch node for transferring data "1".

And the latch circuit 450 includes a cross coupled inverter latch having inverters 453 and 454 for connecting a pair of latch nodes 455 and 456, a latch reset transistor 457 for resetting one of the latch nodes, a pair of write transistors 451 and 452 for connecting to a pair of write data lines 466 and 467 for writing, and a read amplify transistor 458 for reading one of the latch nodes, when a column read transistor 459 is enabled.

In addition, the latch circuit 450 is connected to a data write circuit 460 for overwriting a data in the cross coupled inverter latch of the latch circuit through the pair of write data lines 466 and 467, and a data read circuit 470 for reading an output of the cross coupled inverter latch of the latch circuit through a read data line 457. More specifically, the data write circuit 460 includes an inverting write tri-state inverter 462 and a non-inverting write tri-state inverter 463 for driving the pair of write data lines 466 and 467, a pre-charge transistor 464 and a reset transistor 465 for pre-setting and resetting the pair of write data lines. More detailed operation will be explained as below.

And the write circuit 434 receives an output from the cross coupled inverter latch having inverters 453 and 454 for driving the common line 441, wherein the write circuit 434 includes an inverter having a pull-up transistor 435 and a pull-down transistor 436. And the pull-down transistor 436 is supplied by the pre-charge voltage V0, and a write enable transistor 437 receives an output of the inverter and drives the common line 441 during write operation. And the pre-charge voltage V0 is generated by the pre-charge voltage generator 489 which is set by a fuse circuit (as shown in FIG. 8C). For reading, a read data line 475 is connected to the read amplify transistor 458 which is enabled by the column read transistor 459, where the column read transistor 459 is enabled by a column read signal 469.

And the global amp enable transistor 449 is connected to a locking signal 497, such that the global amp enable transistor 449 is disabled after a read output from the memory cell is reached to the latch circuit 450. And the locking signal 497 is generated by a locking signal generator 490, wherein a delay circuit as the locking signal generator 490 is composed of an AND gate 493 for receiving an output from the latch circuit 450, a tunable delay circuit 494 (as shown in FIG. 8A) for delaying the read output of the latch circuit 450, an buffer 495 for buffering the delayed output, and another AND gate 496 for generating the locking signal 497, while a global read enable signal 491 is asserted to high. The locking signal 497 is generated as long as one of reference memory cells works correctly. In order to generate the locking signal, a reference signal is generated by at least a reference global sense amp comprising the read circuit 440, the latch circuit 450, the write circuit 434, the left select circuit 430 and the right select circuit 438. Similarly, main global sense amp is composed of a read circuit 440', a latch circuit 450', a write circuit 434', a left select circuit 430' and a right select circuit 438'. Furthermore, there are numerous main global sense amps in the columns, even though only one main global sense amp is drawn in the figure.

During read operation, a stored data in the memory cell is transferred to the latch circuit 450 through the sense amps, for instance, high data is transferred to the latch circuit by the local sense amp and the global sense amp with high gain, but low data is not transferred with low gain because the global amp enable transistor 449 connecting to the latch circuit 450 is disabled by the locking signal 497 which is based on high data, before low data is arrived. Furthermore, the latch circuit is also used for write-back operation when the memory cell is accessed because the stored data in the memory cell is destructed by the charges of the local bit line when reading.

After the stored data is reached to the latch circuit 450, a column read signal 469 is asserted to high, so that the read output is transferred to the data read circuit 470 through the read data line 475. When reading data "1", a positive latch node 456 is raised to high from a reset state because the negative latch node 455 is pulled down by the read circuit 440. Hence a read data line 475 is discharged to VSS voltage by the read amplify transistor 458 while the read enable transistor 459 is turned on by asserting the column read signal 469. By discharging the read data line 475, the data output 488 is raised to high through the inverting buffers including 472, 482, 483, 485 and 487, while the read tri-state inverter 482 is turned on but the bypass tri-state inverter 481 is turned off in a data switch circuit 480.

However, data output 488 keeps low when reading data "0", because the read data line 475 is not discharged while the positive latch node 456 keeps reset state, which turns off the read amplify transistor 458 even though the read enable transistor 459 is turned on. Hence, the read data line 475 is maintained to VDD voltage by a cross inverter latch including inverters 472 and 473, where a reset transistor 474 is used for resetting the cross coupled inverter latch during standby. When the memory block is not selected, the positive latch node 456 is reset to VSS voltage by the latch reset transistor 457, which turns off the read amplify transistor 458. Thus, there is no discharge path from the unselected memory block even though the read enable transistor is controlled in column direction, while the read data line 475 is pre-charged to supply voltage VDD, because the read data line 475 is pre-set to VDD voltage by a pre-set transistor 471 while unselected.

During write operation, a data write circuit 460 is activated, such that an inverting write tri-state inverter 462 and a non-inverting write tri-state inverter 463 are enabled for driving the write data line pair 466 and 467, while a pre-charge transistor 464 and a reset transistor 465 are turned off. When writing data "1", the positive latch node 456 is raised to high by forcing the data input 461 to high, such that the non-inverting write tri-state inverter 463 drives the positive data line 467 to high while the column write transistor 452 is turned on, and the inverting write tri-state inverter 462 drives the negative data line 466 to low while the column write transistor 451 is turned on. In contrast, the positive data line 467 is driven to low, and the negative data line 466 is driven to high, when writing data "0".

Figure 5:
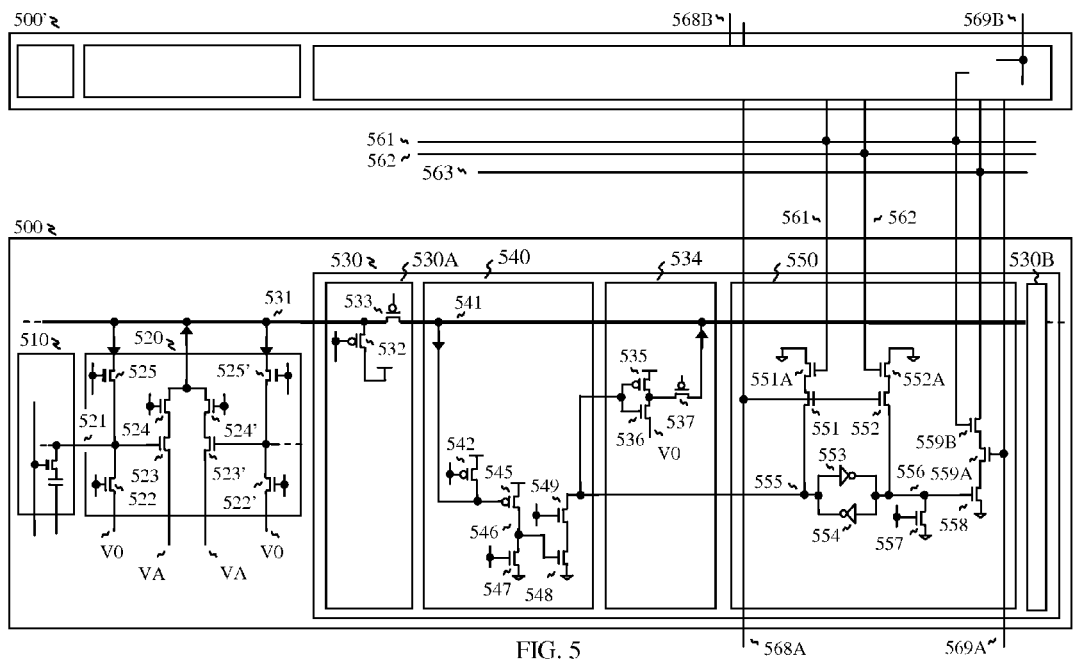
FIG. 5 illustrates an alternative global sense amp with column IO lines, according to the teachings of the present invention.

In FIG. 5, an alternative global sense amp with IO lines in bit line direction is illustrated, wherein a memory block 500 comprises a memory cell 510, a local sense amp 520, and a global sense amp 530. And a pair of write data lines 561 and 562, and a read data line 563 are connected to the global sense amp 530 for writing and reading data. The memory cell 510 and the local sense amp 520 are the same circuit as FIG. 2A. The global sense amp 530 is slightly modified from that of FIG. 2A, for flipping a latch node 555 with NMOS pull-down transistors 548 and 549, wherein the global sense amp 530 includes a read circuit 540, a latch circuit 550, a write circuit 534, a left select circuit 530A and a right select circuit 530B, and those circuits are connected to a common line 541, where the left select circuit 530A and the right select circuit 530B are connected to a left global bit line 531 and a right global bit line respectively, for connecting to multiple local sense amps (not shown). In the configuration, the left select circuit 530A is composed of a global pre-set transistor 532 for pre-setting the left global bit line 531 and a global select transistor 533 for selecting the left global bit line 531, and the right select circuit 530B is composed of the same circuit as the left select circuit.

And the read circuit 540 with NMOS pull-down transistors 548 and 549 is composed of a common pre-set transistor 542 for pre-setting the common line 541, a global pre-amp transistor 545 for reading the common line 541, a global (amp) reset transistor 547 for resetting a global pre-amp node 546 connecting to the global pre-amp transistor 545, and the global main-amp transistor 548 for reading the global pre-amp node 546 when the global amp enable transistor 549 is enabled. And the global amp enable transistor 549 is connected to the left latch node 555 as a negative latch node for transferring data "1".

And the latch circuit 550 includes a cross coupled inverter latch having inverters 553 and 554, a latch reset transistor 557 for resetting the right latch node 556 as a positive latch node, and a row write transistor pair 551 and 552 is connected to a column write transistor pair 551A and 552A which are controlled by a column control line pair 561 and 562 (in column direction). When writing data "1", the negative latch node 555 is pulled down by the series transistors 551 and 551A because a current path is set up by turning on the column write transistor 551A, while the row write transistor 551 is enabled by the row write signal 568A and the column control line 561 is asserted to high. But the other series transistors 552 and 552A are not set up a current path to the positive latch node 556 because the other column control line 562 keeps low, which turns off the other column write transistor 552A.

And the write circuit 534 receives an output from the cross coupled inverter latch for driving the common line 541, wherein the write circuit 534 includes an inverter having a pull-up transistor 535 and a pull-down transistor 536. And the pull-down transistor 536 is supplied by the voltage V0, and a write enable transistor 537 receives an output of the inverter and drives the common line 541 during write operation.

For reading, a read data line 563 in column (bit line) direction is connected to a read path including a read amplify transistor 558 which is enabled by a row read transistor 559A with a row enable signal 569A and a column read transistor 559B with the column control line 561. When the memory block 500 is selected, a read data from selected memory block 500 reads a read data through the read path, but another memory block 500' is not selected because another row enable signal 569B keeps low even though the column control line 561 is common in the column direction. Similarly, a write data is not transferred to another memory block 500' when the row write signal 568B is not asserted during write operation.

Figure 6A:
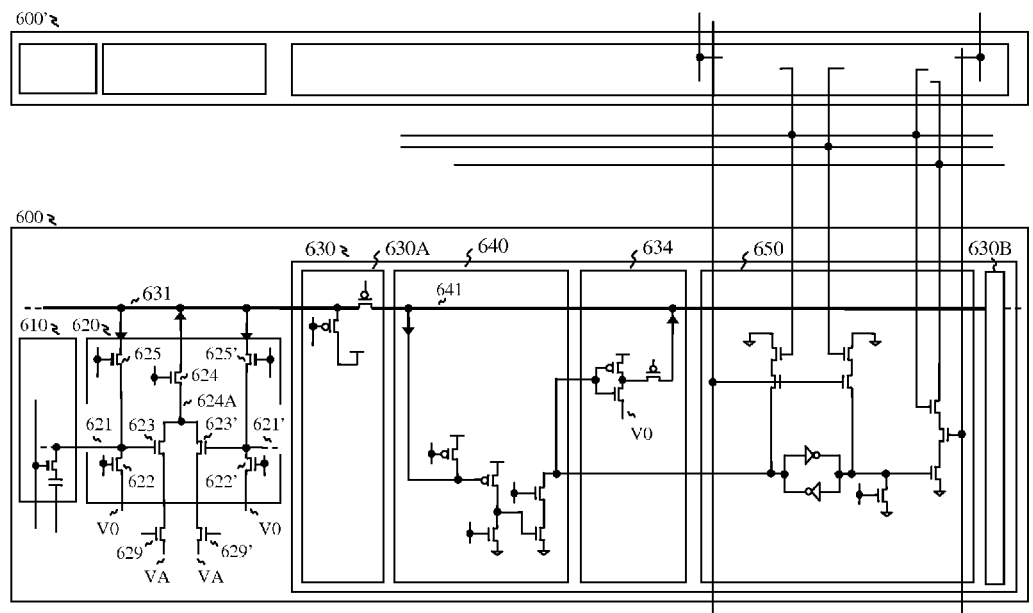
FIG. 6A illustrates an alternative local sense amp with shared local amp enable transistor.

FIG. 6A illustrates an alternative local sense amp with shared local amp enable transistor, wherein a memory block 600 comprises a memory cell 610, a local sense amp 620, and a global sense amp 630.

The local sense amp 620 is similar to that of FIG. 2A, but the local amp enable transistor 624 is shared with a left local sense amp and a right local sense amp, wherein the left local sense amp includes a left local pre-charge transistor 622 for pre-charging the left local bit line 621 to the pre-charge voltage V0, a left local amplify transistor 623 for reading the left memory cell 610 through the left local bit line 621, such that the left local amplify transistor 623 is serially connected to a common local amp enable transistor 624 through a local common node 624A for enabling, where a source of the left local amplify transistor is connected to a left local pull-down transistor 629 for tuning gain and the left local pull-down transistor 629 is connected to the local amp voltage VA. And a left write transistor 625 is connected to the left local bit line 621 for receiving a write data from a global bit line 631.

And the right local sense amp includes a right local pre-charge transistor 622' for pre-charging the right local bit line 621' to the pre-charge voltage V0, a right local amplify transistor 623' for reading the right memory cell through the right local bit line 621', such that the right local amplify transistor 623' is serially connected to the common local amp enable transistor 624 through a local common node 624A for enabling, where a source of the right local amplify transistor is connected to a right local pull-down transistor 629' for tuning gain and the right local pull-down transistor 629' is connected to the local amp voltage VA. And a right write transistor 625' is connected to the right local bit line 621' for receiving a write data from a global bit line 631.

For example, the gain of the amp is increased when the local amp voltage VA is lowered than the pre-charge voltage V0 as explained above, while one of the left local pull-down transistor 629 or the right local pull-down transistor 629' is turned on.

The global sense amp 630 includes the read circuit 640, the latch circuit 650, the write circuit 634, the left select circuit 630A and the right select circuit 630B, and those circuits are connected to the common line 641, where configuration of those circuits are the same as those of FIG. 5. And a main memory block 600' is configured as same as that of the memory block 600 as a reference memory block.

Figure 6B:
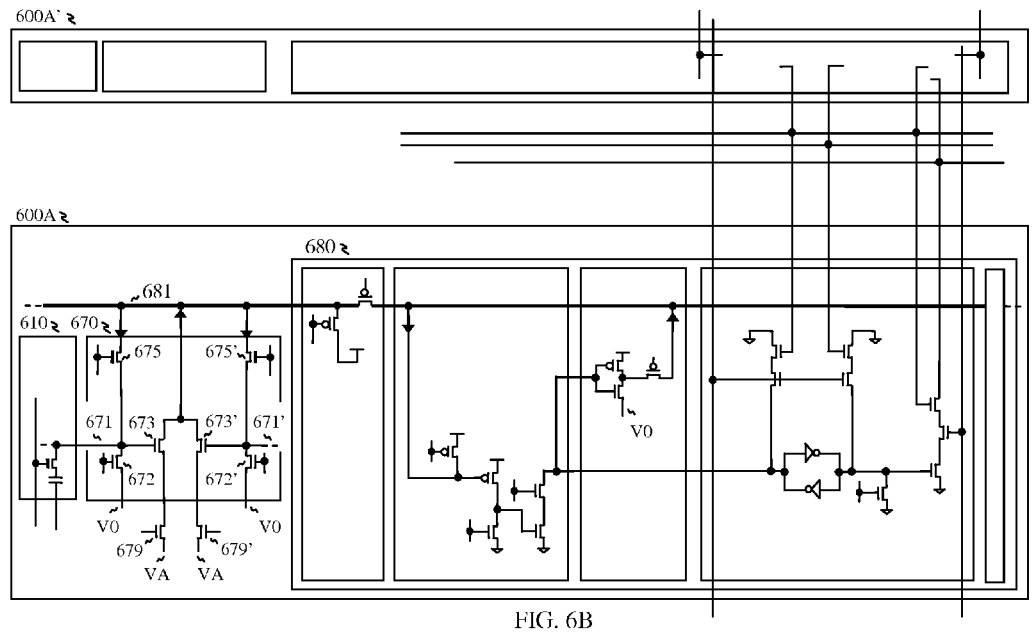
FIG. 6B illustrates an alternative local sense amp with six transistor configuration.

FIG. 6B illustrates an alternative local sense amp with six transistor configuration, wherein a memory block 600A comprises a memory cell 610, a local sense amp 670, and a global sense amp 680. Another memory block 600A' as a main memory block is the same circuit as that of 600A as a reference memory block. And the memory cell 610 and the global sense amp 680 are the same as those of FIG. 6A, but the local sense amp 670 is modified with six transistors for reducing area, wherein the six transistor local sense amp is composed of a left local pre-charge transistor 672 for pre-charging the left local bit line 671 to the pre-charge voltage V0, a left local amplify transistor 673 for reading the left memory cell 610 through the left local bit line 671, a left write transistor 675 is connected to the left local bit line 671 for receiving a write data from a global bit line 681, a right local pre-charge transistor 672' for pre-charging the right local bit line 671' to the pre-charge voltage V0, a right local amplify transistor 673' for reading the right memory cell 610 through the right local bit line 671', a right write transistor 675' is connected to the right local bit line 671' for receiving the write data from a global bit line 681. And a drain node of the left local amplify transistor 673 is connected to the global bit line 681 and a source node of the left local amplify transistor 673 is connected to a left local pull-down transistor 679 for amplifying, where the left local pull-down transistor 679 is connected to the local amp voltage VA for tuning gain of the amplifier. And a drain node of the right local amplify transistor 673' is connected to the global bit line 681 and a source node of the right local amplify transistor 673' is connected to a right local pull-down transistor 679' for amplifying, where the right local pull-down transistor 679' is connected to the local amp voltage VA for tuning gain of the amplifier.

Referring now to FIG. 6C in view of FIG. 6A, example layout for the local sense amp 670 is illustrated, wherein the local sense amp 670 includes poly gate 672 as the left local pre-charge transistor, poly gate 673 as the left local amplify transistor, poly gate 675 as the left write transistor, poly gate 672' as the right local pre-charge transistor, poly gate 673' as the right local amplify transistor, and poly gate 675' as the right write transistor. The left local pre-charge transistor 672 is connected to the pre-charge voltage V0 and the left local amplify transistor 673 is connected to the left local pull-down transistor through a common pull-down node 673A. The transistors are composed of n+ active region on p-well region (PW). In FIG. 6D, metal-1 (M1) region and via-1 region are defined, such that metal-1 region 671 serves as the left local bit line. And in FIG. 6E, metal-2 (M2) region and via-2 are defined. In FIG. 6F, metal-3 (M3) region is defined as the global bit line 681 for connecting to the left write transistor 675, the right write transistor 675', the left local amplify transistor 673, and the right local amplify transistor 673'.

In FIG. 6G, an equivalent circuit of the local sense amp 670 is illustrated, wherein the local sense amp 670 includes the left local pre-charge transistor 672 for pre-charging the left local bit line 671 to the pre-charge voltage V0, the left local amplify transistor 673 for reading the left memory cell 610 through the left local bit line 671, the left local write transistor 675 connecting to the left local bit line 671 and the global bit line 681, the right local pre-charge transistor 672' for pre-charging the right local bit line 671' to the pre-charge voltage V0, the right local amplify transistor 673' for reading the right memory cell through the right local bit line 671', the right local write transistor 675' connecting to the right local bit line 671' and the global bit line 681, wherein the left local amplify transistor 673 is connected to the left local pull-down transistor 679 and the global bit line 681, and the right local amplify transistor 673' is connected to the right local pull-down transistor 679' and the global bit line 681. In the figure, node numbers are the same as FIG. 6B to 6E for ease of understanding.

FIG. 7A illustrates an alternative local sense amp with PMOS main-amp transistor, wherein a memory block 700 comprises a memory cell 710, a local sense amp 720, and a global sense amp 730. The local sense amp 720 includes PMOS main-amp transistor, such that the local pre-set transistor 725 is connected to the local main-amp transistor 726 which is shared with a left local sense amp and a right local sense amp, wherein the left local sense amp includes the left local pre-charge transistor 722 for pre-charging the left local bit line 721 to the pre-charge voltage V0, the left local amplify transistor 723 connecting the local main-amp transistor 726 through a local pre-amp node 724 for reading the left memory cell 710, and the left write transistor 728 connecting to the left local bit line 721 for receiving the write data from the global bit line 731. And the right local sense amp includes the right local pre-charge transistor 722' for pre-charging the right local bit line to the pre-charge voltage V0, the right local amplify transistor 723' connecting the local main-amp transistor 726 through the local pre-amp node 724 for reading the right memory cell, and the right write transistor 728' connecting to the right local bit line for receiving the write data from the global bit line 731. Alternatively, a capacitor can be connected to the local pre-amp node 724 for adjusting discharge time. And the left local pull-down transistor 729 is connected to the left local amplify transistor 723 for supplying the local amp voltage VA, and the right local pull-down transistor 729' is connected to the right local pull-down transistor 723' for supplying the local amp voltage VA.

And the global sense amp 730 includes the read circuit 740, the latch circuit 750, the write circuit 734, the left select circuit 730A and the right select circuit 730B, and those circuits are connected to the common line 741, where configuration of those circuits are similar to those of FIG. 6A, but with the PMOS main-amp transistor 726, phase of the global bit line 731 is inverted, so that the read circuit 740 of the global sense amp 730 is modified for recovering the phase of the global bit line, wherein the read circuit 740 is composed of a common pre-charge transistor 742 for pre-charging the common line 741 to the pre-charge voltage V0, a global pre-amp transistor 743 connecting to a global pre-amp node 744 for reading the common line 741, a global pre-set transistor 745 for pre-setting the global pre-amp node 744, a global middle-amp transistor 746 for reading to the global pre-amp node 744, a global main reset transistor 747 for resetting a global main-amp node 744 which is connected to the global middle-amp transistor 746, and the global main-amp transistor 748 for reading the global pre-amp node 744 when the global amp enable transistor 749 is enabled. And the global amp enable transistor 749 is connected to the latch circuit 750.

Referring now to FIG. 7B in view of FIG. 7A, example layout for the local sense amp 720 is illustrated, wherein the local sense amp 720 includes poly gate 722 as the left local pre-charge transistor, poly gate 723 as the left local amplify transistor, poly gate 728 as the left write transistor, poly gate 722' as the right local pre-charge transistor, poly gate 723' as the right local amplify transistor, poly gate 728 as the right write transistor, and a shared circuit including poly gate 725 as the local pre-set transistor and poly gate 726 as the local main-amp transistor. And the local pre-amp node 724 is used a common node for connecting the left local sense amp and the right local sense amp. The left local pre-charge transistor 722 is connected to the pre-charge voltage V0 and the left local amplify transistor 723 is connected to the left local pull-down transistor 729 through a drain node 729A. The transistors 722, 723, 722' and 723' are composed of n+ active region on p-well region (PW), and other PMOS transistors 725, 726, 728 and 728' are composed of p+ active region on n-well region (NW).

In FIG. 7C, metal-1 (M1) region and via-1 region are defined, such that metal-1 region 721 serves as the left local bit line and metal-1 region 724 serves as the local pre-amp node. And in FIG. 7D, metal-2 (M2) region and via-2 are defined. In FIG. 7E, metal-3 (M3) region is defined as the global bit line 731 for connecting to drain node of the left write transistor 725, the right write transistor 725' and drain node of the local main-amp transistor 726.

In FIG. 7F, an equivalent circuit of the local sense amp 720 is illustrated, wherein the local sense amp 720 includes the left local pre-charge transistor 722 for pre-charging the left local bit line 721 to the pre-charge voltage V0, the left local amplify transistor 723 for reading the left memory cell 710 through the left local bit line 721, the right local pre-charge transistor 722' for pre-charging the right local bit line 721' to the pre-charge voltage V0, the right local amplify transistor 723' for reading the right memory cell through the right local bit line 721', the local pre-set transistor 725 for connecting to the left local amplify transistor 723 and the right local amplify transistor 723' through a local pre-amp node 724, the local main-amp transistor 726 for reading the local pre-amp node 724 connecting to the left local amplify transistor 723 and the right local amplify transistor 723'. And the left local pull-down transistor 729 is connected to the left local amplify transistor 723 for supplying the local amp voltage VA, and the right local pull-down transistor 729' is connected to the right local pull-down transistor 723' for supplying the local amp voltage VA, where node numbers are the same as FIG. 7A to 7E for ease of understanding.

In FIG. 8A, more detailed a tunable delay circuit (as shown 294 in FIG. 2A) is illustrated, wherein multiple delay units 801, 802 and 803 are connected in series, the first delay unit 801 receives input IN and generates output OUT, the second delay unit 802 is connected to the first delay unit, and the third delay unit 803 is connected to the second delay unit 802 and generates outputs 804 and 805, and so on. Each delay unit receives a fuse signal, such that the first delay unit receives F0, the second delay unit receives F1, and a third delay unit receives F2. And more detailed delay unit is illustrated in FIG. 8B, wherein the delay unit 810 receives an input IN0 and a fuse signal Fi, thus the fuse signal Fi selects output from the input IN0 or input DL1, so that a transfer gate 811 is turned on when the fuse signal Fi is low and output of inverter 813 is high, otherwise another transfer gate 812 is turned on when the fuse signal Fi is high and output of inverter 813 is low to bypass DL1 signal. Inverter chain 814 and 815 delays IN0 signal for the next delay unit, where more inverter chains or capacitors can be added for the delay even though the drawing illustrates only two inverters.

In FIG. 8C, a related fuse circuit of the tunable delay circuit (as shown in FIG. 8A) is illustrated in order to store information for the delay circuit, so that a fuse serves as a nonvolatile memory, wherein a fuse 821 is connected to a latch node 822, a cross coupled latch including two inverters 825 and 826 are connected to the latch node 822, pull-down transistors 823 and 824 are serially connected to the latch node 822 for power-up reset. Transfer gate 830 is selected by a select signal 829 (high) and another select signal 828 (low) in order to bypass the latch node output 822 through inverter 825 and 827. In doing so, fuse data is transferred to output node Fi, otherwise test input Ti is transferred to Fi when a transmission gate 831 is turned on.

In FIG. 8D, a variable voltage regulator is illustrated for supplying variable voltage V0 to the reduced swing amplifiers, wherein a reference voltage 855 is generated by a variable voltage reference circuit, such that a first resistor 852 is connected to a second resistor 853, the second resistor 853 is connected to a third resistor 854, and the third resistor 854 is connected to a fourth resistor 856, serially. Hence, the supply voltage VDD is reduced to the reference voltage output 855 by the ratio of the resistance value. And the reference voltage output 855 is tunable with turn-on or turn-off state of the transistors 850 and 851. In addition, the transistors are controlled by control signals Fa and Fb, respectively. And the control signals Fa and Fb are generated by the fuse circuit as shown in FIG. 8C, where turn-on resistance of the transistor is much smaller than the resistance value of the resistor. And the reference voltage 855 is buffered by an op amp 858, so that the variable voltage V0 is generated by the op amp 858 and a big driver transistor 859. Generally, a voltage difference between two op amp inputs 855 and 857 is equal or very close. In doing so, the variable voltage output V0 is almost equal to the reference voltage 855. And a weak current sink transistor 861 is connected to the V0 voltage output 857 for stabilizing the output, wherein the current sink transistor 861 is controlled by a bias voltage Vbias.

While the descriptions here have been given for configuring the memory circuit and structure, alternative embodiments would work equally well with reverse configuration, such that PMOS transistor can be used as the pass transistor. Other circuits including the local sense amp and the global sense amp are reversed. And signal polarities are also reversed to control the reverse configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
    a memory cell connecting to a local bit line, wherein the memory cell is composed of a pass transistor and a capacitor for configuring a dynamic random access memory;
    a tunable gain amp serving as a local sense amp, wherein the tunable gain amp includes a local pre-charge transistor pre-charging the local bit line to a pre-charge voltage, a local amplify transistor whose source is connected to a local amp voltage for tuning gain and whose gate is connected to the local bit line for reading the memory cell, a local amp enable transistor connecting to a drain of the local amplify transistor serially for enabling, and a write transistor connecting to the local bit line for receiving a write data from a global bit line;

a global sense amp connecting to the local sense amp through the global bit line, wherein the global sense amp includes a read circuit, a latch circuit, a write circuit, and at least a select circuit, such that the read circuit reads the global bit line through the select circuit when reading, the latch circuit receives and stores an output from the read circuit or a pair of write data bus, the write circuit receives an output from the latch circuit and drives the global bit line through the select circuit when writing, and the global bit line is pre-set to a pre-set voltage by a global pre-set transistor of the select circuit when standby;

a pre-charge voltage generator for generating the pre-charge voltage;

a local amp voltage generator for generating the local amp voltage;

a delay circuit as a locking signal generator for generating a delayed signal for disabling a global amp enable transistor of the read circuit when reading, wherein the delayed signal is generated by an output from the latch circuit.

2. The memory device of claim 1, wherein the local sense amp includes a shared local amp enable transistor for reducing area, such that the local sense amp includes a left local pre-charge transistor for pre-charging a left local bit line to the pre-charge voltage, a left local amplify transistor for reading a left memory cell through the left local bit line, a right local pre-charge transistor for pre-charging a right local bit line to the pre-charge voltage, a right local amplify transistor for reading a right memory cell through the right local bit line, the shared local amp enable transistor connecting to the left local amplify transistor and the right local amplify transistor for transferring a read output to the global bit line, a left write transistor connecting to the left local bit line for receiving the write data from the global bit line, and a right write transistor connecting to the right local bit line for receiving the write data from the global bit line.

3. The memory device of claim 1, wherein the local sense amp is composed of six transistors, such that the local sense amp includes a left local pre-charge transistor for pre-charging a left local bit line to the pre-charge voltage, a left local amplify transistor for reading a left memory cell through the left local bit line, a right local pre-charge transistor for pre-charging a right local bit line to the pre-charge voltage, a right local amplify transistor for reading a right memory cell through the right local bit line, a left write transistor connecting to the left local bit line for receiving the write data from the global bit line, and a right write transistor connecting to the right local bit line for receiving the write data from the global bit line, where the left local amplify transistor and the right local amplify transistor are connected to the global bit line for transferring amplified output.

4. The memory device of claim 1, wherein the local sense amp includes a left local pre-charge transistor for pre-charging a left local bit line to the pre-charge voltage, a left local amplify transistor for reading a left memory cell through the left local bit line, a right local pre-charge transistor for pre-charging a right local bit line to the pre-charge voltage, a right local amplify transistor for reading a right memory cell through the right local bit line, a local pre-set transistor for pre-setting a local pre-amp node connecting to the left local amplify transistor and the right local amplify transistor, and a local main-amp transistor for reading the local pre-amp node.

5. The memory device of claim 1, wherein the read circuit includes a common pre-set transistor for pre-setting a common line to the pre-charge voltage, a global pre-amp transistor for reading the common line, a global reset transistor for resetting a global pre-amp node connecting to the global pre-amp transistor, and a global main-amp transistor for reading to the global pre-amp node when a global amp enable transistor is enabled; and the common line is connected to the global bit line through the select circuit.

6. The memory device of claim 1, wherein the write circuit includes an inverter connecting to one of latch nodes of the latch circuit, and a write enable transistor receiving an output of the inverter and driving a common line which is connected to the select circuit for connecting to the global bit line, where the inverter is composed of a pull-up transistor and a pull-down transistor, and a source of the pull-down transistor is connected to the pre-charge voltage generator.

7. The memory device of claim 1, wherein the latch circuit includes a cross coupled inverter latch connecting to a pair of latch nodes, a latch reset transistor for resetting one of the latch nodes, and a pair of series transistors having a row select transistor pair for connecting to the pair of the latch nodes and a column select transistor pair for connecting to a pair of data lines.

8. The memory device of claim 1, wherein the latch circuit includes a cross coupled inverter latch connecting to a pair of latch nodes, a latch reset transistor for resetting one of the latch nodes, a pair of write series transistors having a row write transistor pair for connecting to the pair of the latch nodes and a column write transistor pair for connecting to a pair of data lines, and a read amplify transistor for reading one of the latch nodes, when a row read transistor and a column read transistor are enabled.

9. The memory device of claim 1, wherein the latch circuit includes a cross coupled inverter latch connecting to a pair of latch nodes, a latch reset transistor for resetting one of the latch nodes, a pair of write transistors for connecting to a pair of write data lines, and a read amplify transistor for reading one of the latch nodes, when a column read transistor is enabled.

10. The memory device of claim 1, wherein the latch circuit is connected to a data write circuit for overwriting a data to the latch circuit through a write data line pair, a data read circuit for reading an output of the cross coupled inverter latch of the latch circuit through a read data line; more specifically, the data write circuit includes an inverting write tri-state inverter and a non-inverting write tri-state inverter for driving the write data line pair, a pre-set transistor for pre-setting one of the write data line pair, and a reset transistor for resetting one of the write data line pair.

11. The memory device of claim 1, wherein the pre-charge voltage generator generates the pre-charge voltage, such that fuse circuits are used for setting the pre-charge voltage.

12. The memory device of claim 1, wherein the local amp voltage generator generates the local amp voltage, such that fuse circuits are used for setting the local amp voltage.

13. The memory device of claim 1, wherein the delay circuit includes tunable delay elements for adjusting delay time.

14. The memory device of claim 1, wherein the delay circuit includes tunable delay elements which are set by fuse circuits.

* * * * *